US005773998A

United States Patent [19]

Hughes et al.

[11] Patent Number: 5,773,998

[45] Date of Patent: Jun. 30, 1998

[54] SWITCHED CURRENT CIRCUITS

[75] Inventors: John B. Hughes, Hove; Kenneth W. Moulding, Horley, both of England

[73] Assignee: U.S. Philips Corporation, New York, N.Y.

[21] Appl. No.: 708,160

[22] Filed: Aug. 27, 1996

[30] Foreign Application Priority Data

Aug. 31, 1995 [GB] United Kingdom ................... 9517790

[51] Int. Cl.[6] ..................................................... G11C 27/02

[52] U.S. Cl. .............................. 327/91; 327/94; 327/334; 327/552

[58] Field of Search ..................................... 323/315, 316, 323/317; 327/91, 94, 95, 334, 335, 337, 552, 554, 336

[56] References Cited

U.S. PATENT DOCUMENTS 5,349,245 9/1994 Hughes et al. .......................... 307/353
5,400,273 3/1995 Hughes et al. ............................ 365/45
5,666,303 9/1997 Hughes et al. ............................ 365/45

*Primary Examiner*—Timothy P. Callahan
*Assistant Examiner*—Jeffrey Zweizig
*Attorney, Agent, or Firm*—Steven R. Biren

[57] ABSTRACT

Circuit blocks for integrating/differentiating input signals in the form of sampled currents include coupled current memories where the second current memory has a plurality of scaled outputs which feed switching arrangements. Resistors are provided in the current memories, the resistance of the resistors being equal to the "on" resistance of the switching arrangement multiplied by any multiplying factor applied to this output to which the switching arrangement is coupled.

8 Claims, 5 Drawing Sheets

SWITCHED CURRENT CIRCUITS

BACKGROUND OF THE INVENTION

The invention relates to a circuit arrangement for processing sampled analogue currents comprising an input for receiving said sampled analogue currents, first and second current memories each having an input coupled to the input of the circuit arrangement and an output coupled to the input of the other current memory, the second current memory having at least one further output coupled to an output of the circuit arrangement, wherein the first and second current memories each comprise a first, coarse, current memory cell and a second, fine, current memory cell, and a switching arrangement couples the further output to said output of the circuit arrangement.

Such a circuit arrangement is disclosed in EP-A-0 642 095 A (PHB33875) and a book edited by C. Toumazou, J. B. Hughes, and N. C. Battersby entitled "SWITCHED-CURRENTS an analogue technique for digital technology" and published by Peter Peregrinus Limited in 1993.

Switched current circuits have a number of applications one of which is in realizing filters which may use bi-quad sections comprising integrators or differentiators. Such integrators and differentiators typically comprise two interconnected current memories and a switching network for selectively applying input currents and/or deriving output currents on particular phases of a clock signal operating at the sampling rate. When using the original simple current memories proposed for switched current circuits the performance of the integrators and differentiators was inadequate for many purposes and various circuit enhancements of these current memory cells were sought which eventually resulted in the invention of composite current memories (S2I memories) as disclosed in EP-A-0 608 936 (PHB33830) which gave an enhanced performance using a two step approach in which during a first time a coarse sampling of the input current is effected and subsequently a correction of the error is obtained by sampling the difference between the input current and the stored coarse sample.

It has been found, however, that even with the use of S2I memories the performances of switched current integrators and differentiators is still not adequate to meet all the requirements of high performance filters.

SUMMARY OF THE INVENTION

It is an object of the invention to mitigate at least some of the imperfections in known switched current integrators and for differentiators and the circuits employing them.

The invention provides a circuit arrangement for processing sampled analogue currents comprising an input for receiving said sampled analogue currents, first and second current memories each having an input coupled to the input of the circuit arrangement and an output coupled to the input of the other current memory, the second current memory having at least one further output coupled to an output of the circuit arrangement, wherein the first and second current memories each comprise a first, coarse, current memory cell and a second, fine, current memory cell, and a switching arrangement couples the further output to said output of the circuit arrangement characterised in that a resistor is connected between the input and first output of the second current memory, said resistor being substantially equal to the 'on' resistance of said switching arrangement multiplied by the scale factor relating to the relative magnitudes of the first and further output currents.

It has been found that one of the causes of errors in such integrators and differentiators is the "on" resistance of the switches which causes the voltage at the output of the current memory to differ from the reference voltage by the voltage drop across the signal carrying switch at the output of the current memory. This voltage drop is of course signal dependent since it is dependent on the current passed by the switch. By providing the resistance between the input and first output of the current memory cell the voltage drop across the switch caused by its "on" resistance can be compensated.

The second current memory may comprise a plurality of further outputs, each of which is coupled via an individual further switching arrangement wherein each further switching arrangement has a switch "on" resistance substantially equal to said resistance divided by the relative magnitude of its current output to the first current output.

This allows a plurality of scaled outputs to be produced so that a plurality of further circuit arrangements can be fed.

The resistor may comprise a transistor of the same type and W/L as those forming the switching arrangement said transistor being held "on" by the same voltage as that of the switching signal which causes the switching arrangement to be switched on.

This enables accurate tracking of the switch resistance with varying signal current. Since the resistance and switches are formed by similar components and are fed with identical voltages their behaviour with varying currents will be substantially the same.

The first current memory cell may have a further output, the further output being coupled to an output of the circuit arrangement by a respective switching arrangement wherein a resistor is connected between the input and output of the first current memory, said resistor having a resistance substantially equal to the "on" resistance of said switching arrangement multiplied by the scale factor relating to the relative magnitudes of the first and further output currents.

This enables balanced currents to be processed by suitably interconnecting the inputs and outputs of two such circuit arrangements. Consequently structures handling balanced currents can be conveniently implemented using arrangements known per se but retaining the improved performance by compensating for voltage drops across the switches.

The invention further provides a biquadratic filter section comprising a plurality of such circuit arrangements.

BRIEF DESCRIPTION OF THE DRAWING

The above and other features of the invention will become apparent from the following description by way of example, of embodiments of the invention with reference to the accompanying drawings, in which.

DESCRIPTION OF THE PREFERRED EMBODIMENTS

A problem to be mitigated by the invention and the way in which it is achieved will be described by first illustrating the problem with reference to FIG. 1 which shows a prior art integrator and subsequently describing embodiments of integrator and differentiator circuits according to the invention and then the way in which such integrators and differentiators can be combined into simple biquadratic sections.

Figure 1:
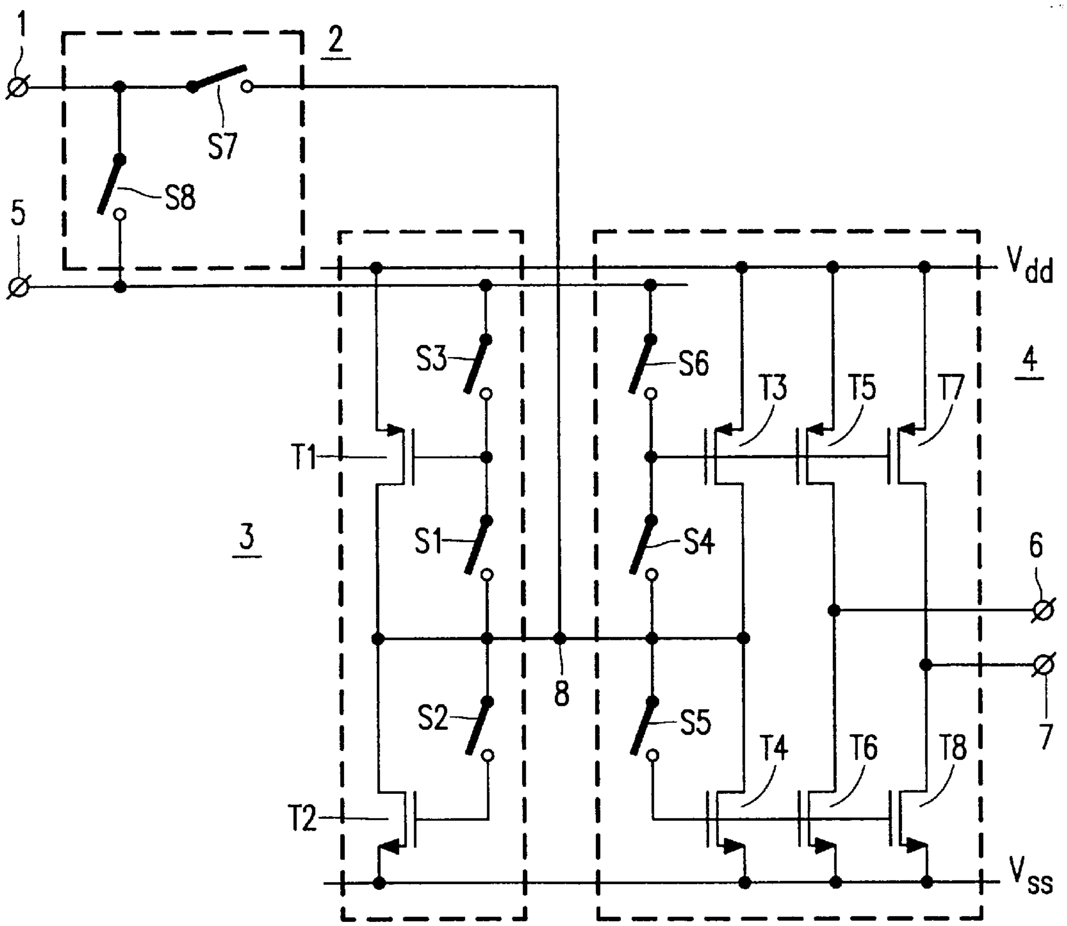
FIG. 1 PRIOR ART
FIG. 1 is a prior art example of a switched current integrator.

The integrator shown in FIG. 1 has an input terminal 1 which is connected to a switching arrangement 2. The switching arrangement is connected to a node 8 which forms the inputs and outputs of two current memory circuits 3 and 4. The current memory circuit 3 comprises a P-channel field effect transistor T1 whose source electrode is connected to a supply rail $V_{dd}$ and an N-channel field effect transistor T2 whose source electrode is connected to a supply rail $V_{SS}$. The drain electrodes of transistors TI and T2 are connected together and to the node 8. The node 8 is further connected to the gate electrode of transistor T1 via a switch S1 and to the gate electrode of transistor T2 via a switch S2. An input terminal 5 to which a reference voltage Ve is applied is connected by a switch S3 to the gate electrode of transistor T1. The current memory circuit 4 comprises a P-channel field effect transistor T3 whose source electrode is connected to the supply rail $V_{dd}$ and an N-channel field effect transistor T4 whose source electrode is connected to the supply rail $V_{ss}$. The drain electrodes of transistors T3 and T4 are commoned and connected to the node 8. The node 8 is further connected via a switch S4 to the gate electrode of transistor T3 and via a switch S5 to the gate electrode of transistor T4. The input terminal 5 is connected via a switch S6 to the gate electrode of transistor T3. The node 8 comprises the input to the current memory circuit 3 when the switches Si or S2 are closed and forms the output of the current memory circuit 3 when both switches SI and S2 are open. Similarly the node 8 comprises the input to the current memory cell 4 when the switches S4 and S5 are closed and forms the output of the current memory circuit 4 when the switches S4 and S5 are both open. The current memory circuit 4 comprises two further P-channel field effect transistors T5 and T7 whose source electrodes are connected to the positive supply rail $V_{dd}$ and two further N-channel field effect transistors T6 and T8 whose source electrodes are connected to the supply rail $V_{SS}$. The drain electrodes of transistors T5 and T6 are commoned and connected to an output terminal 6 while the drain electrodes of transistors T7 and T8 are commoned and connected to an output terminal 7. The gate electrodes of transistors T5 and T7 are connected to the gate electrode of transistor T3, while the gate electrodes of transistor T6 and T8 are connected to the gate electrode of transistor T4. The outputs 6 and 7 form further outputs of the current memory circuit 4. The transistors T5 and T6 have a channel width to length ratio of α1 times that of transistors T3 and T4 while transistors T7 and T8 have a channel width the length ratio of α2 times that of transistors T3 and T4. The switching arrangement 2 comprises a first switch S7 which connects the input terminal 1 to the node 8 and a second switch S8 which connects the input terminal 1 to the reference voltage Ve (terminal 5).

Figure 2:
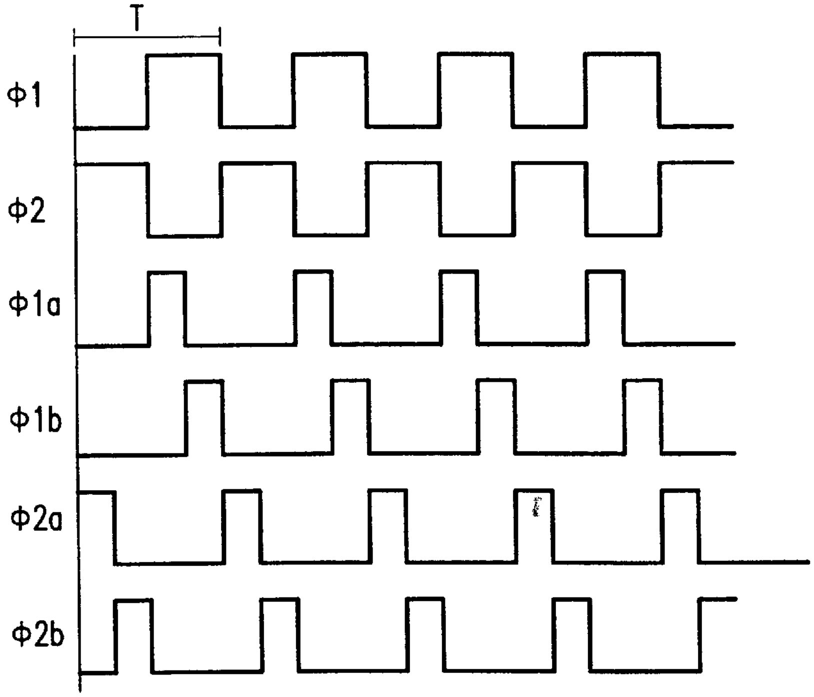
FIG. 2 illustrates timing waveforms which operate the various switches in the embodiments.

FIG. 2 shows switching wave forms which operate the switches within the integrator shown in FIG. 1. As shown in FIG. 2 within a sampling period T of the input sampled current the waveforms ϕ1 and ϕ2 are the inverse of each other and are each split into two subphases ϕ1*a* and ϕ1*b* and ϕ2*a* and ϕ2*b*. In FIG. 1 switch S7 is closed during the period ϕ1 whilst S8 is closed during the period ϕ2. Switch S1 is closed during period ϕ1*b*, and switch S2 and S3 are closed during period ϕ1*a*a. Switch S4 is closed during the period ϕ2*b* while switches S5 and S6 are closed during the period ϕ2*a*. In operation the input current i is fed to the node 8 during the ϕ1 period of each sampling period. During the first portion of ϕ1, that is ϕ1*a*, switches S2 and S3 are closed. This causes transistor Ti to act as a bias current source while transistor T2 samples the input current at node 8. Thus the current sampled by transistor T2 is the input current i+J where J is the bias current which is produced by transistor T1. At the end of the period ϕ1*a* switch S2 opens and transistor T2 conducts the current i+J+Δi, where Δi is an error current caused by the transistor T2. Switch S1 closes during the period ϕ1*b* and this will cause the transistor T1 to sense the difference between the input current and the current i+J+Δi flowing through transistor T2. Thus the transistor TI will eventually settle to conduct a current close to J+Δi. At the end of the period ϕ1 the current memory cell 3 will produce the current i at the node 8. During phase ϕ2 the switch S7 is open and hence the input current from input 1 is interrupted and the current i produced by the current memory cell 3 is applied to the current memory cell 4. This will sense that current during phase ϕ2 and output the current during the phase ϕ1 of the next sample period.

During the ϕ1 phase of the next sample period the input current i(n) plus the output current i (n−1) from the current memory cell 4 are both applied to the input of the current memory cell 3. This process is repeated for each sample period of the input current. As has been demonstrated by the analysis in the book referred to hereinbefore this produces an integrated version of the input signal applied to input 1 at the output 6 and 7. In a filter network these output currents would flow to other integrators via switch arrangements similar to the switch arrangement 2 at the input of the other integrators. These switch arrangements may receive a multiplicity of currents from a number of integrators. As a result voltage drop through the switching arrangement 2 due to the "on" resistance of its switches is variable and consequently is difficult to compensate. It produces no error in the currents flowing in the memory loop, that is between the current memory circuits 3 and 4, since they exchange currents without the need for switches. The output mirror circuits, however, are terminated with a voltage which would ideally be Ve but which is made uncertain by the voltage drop on the switches of the driven integrators. This produces a voltage difference at the drain electrodes of the transistors T5 and T6 and T7 and T8 which causes an error in the effective value of the coefficient α1 and α2.

Figure 3:
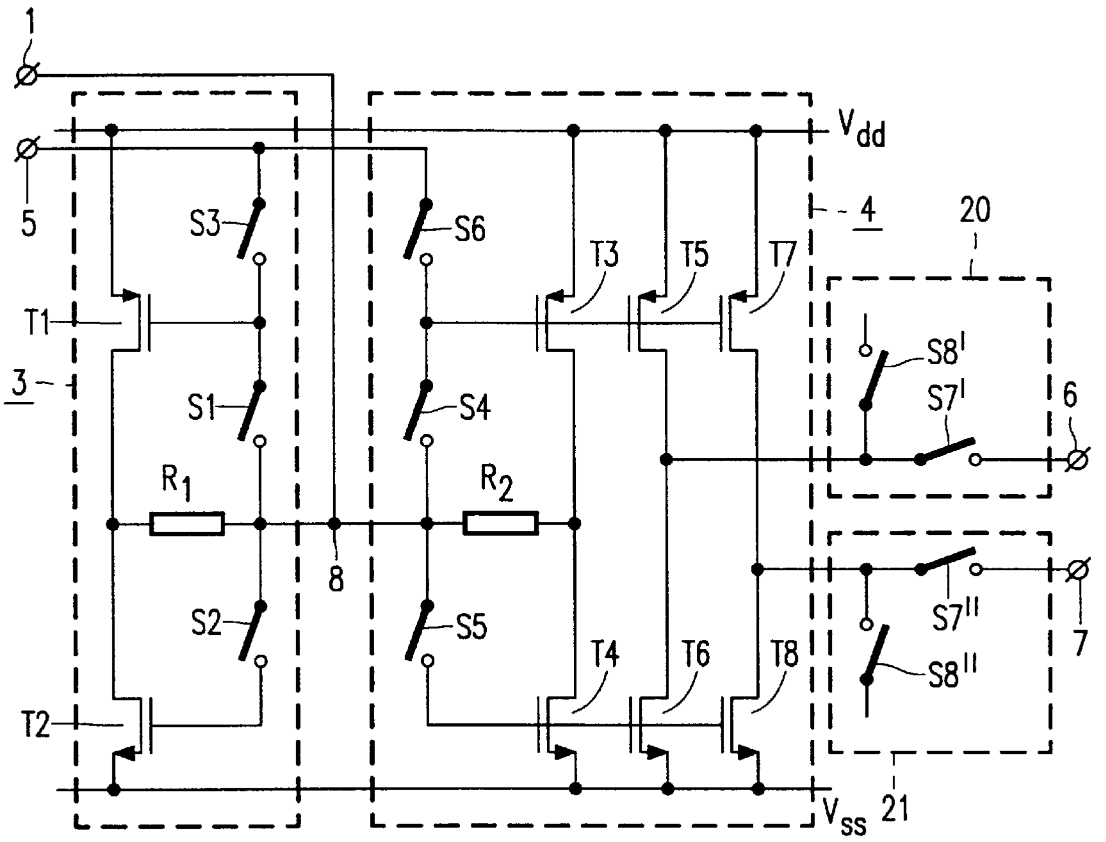
FIG. 3 is a circuit diagram of a circuit arrangement according to the invention.

FIG. 3 shows an arrangement according to the invention and the same reference signs are used in FIG. 3 for equivalent components to those used in FIG. 1. It will be seen that the difference between the arrangements of FIG. 3 and FIG. 1 is in the removal of the switching arrangement 2 from the input and its replacement by two switching arrangements 20 and 21 at the outputs of the arrangement and in the provision of resistors R1 and R2. The first of which is connected between the drain electrodes of transistor T1 and T2 and the junction of the switches SI and S2 and the second of which is connected between the drain electrodes of transistors T3 and transistors T4 and the junction of the switches S4 and S5. The resistors R1 and R2 are formed by transistors, as are the switching arrangement 20 and 21. The transistors forming the R1 and R2 are held permanently on by applying a potential to their gate electrodes which is equal to the switching "on" potential on the gates of the transistors forming the switches in switching arrangements 20 and 21.

The transistors forming the switches S7' and S7' within the switching arrangements 20 and 21 are dimensioned so that their on resistance divided by the gain ratio of $\alpha 1$ or $\alpha 2$ is equal to the resistance of the transistors forming the resistances R1 and R2.

Figure 4:
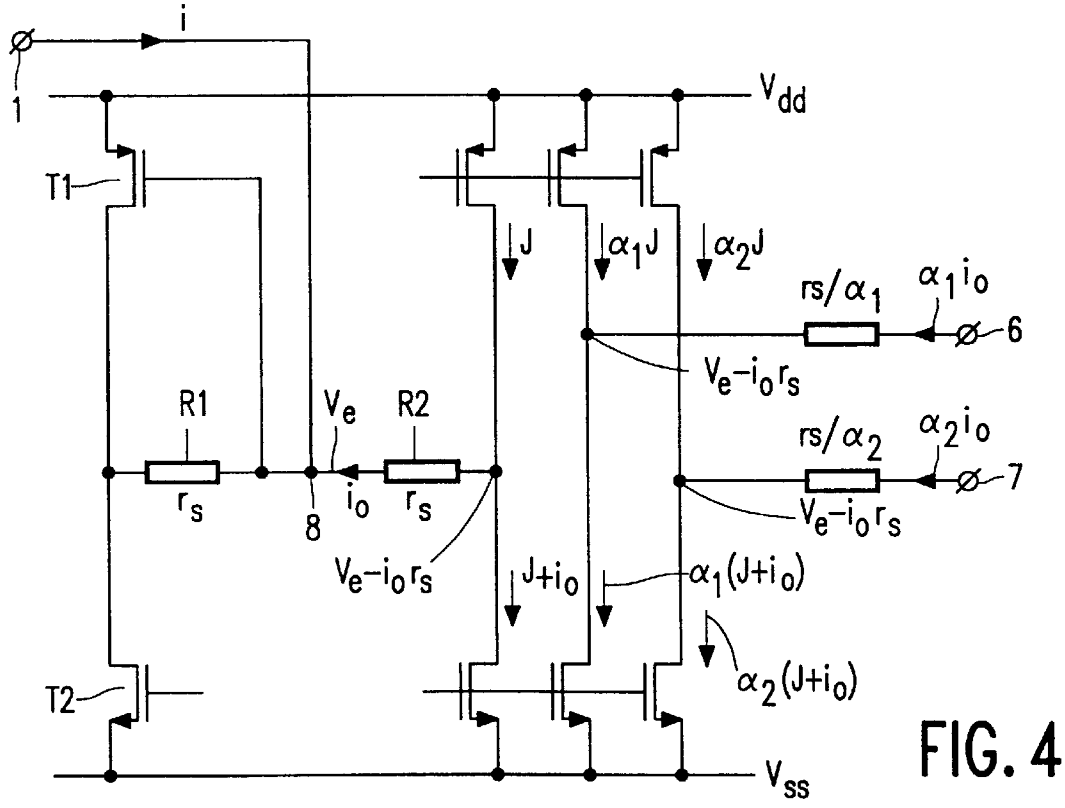
FIG. 4 shows the circuit arrangement of FIG. 3 when outputting currents to illustrate the switch resistance compensation.

FIG. 4 illustrates the situation during phase $\phi 1$ where output currents are being fed from the outputs 6 and 7 to further integrators or differentiators in a filter network. It is assumed that the other integrators and/or differentiators are of the same form as that described with reference to FIG. 3. Thus during phase $\alpha 1b$ the voltage at the node 8 will be very close to Ve since the error current sensed by the fine current memory cell comprising transistor T1 and switch S1 is very small and hence will not change the voltage at the gate electrode of transistor T1 significantly. This means that the voltage at the junction of the drain electrodes of transistor T3 and T4 will be equal to Ve-$i_o r_s$, where $i_o$ is the output current from the second current memory circuit 4 and $r_s$ is the resistance of resistor R2. Consequently, this will mean that the voltage at the junctions of transistors T5 and T6 and T7 and T8 will also be at the potential Ve-$i_o r_s$. The output terminals 6 and 7 will be connected to an equivalent of node 8 in a further integrator and/or differentiator and hence will be at the potential Ve. Since the output current $\alpha 1$ $i_i$ passes through a resistance of $r_s$ divided by $\alpha 1$ the voltage at the junction of the drain electrodes of transistors T5 and T6 will be Ve - $i_o r_s$. Thus the output mirrors are terminated with the voltage Ve - $i_o r_s$ and there is no voltage difference between those nodes and the junction of the transistors T3 and T4 in the second current memory circuit. Consequentially the output mirror accuracy is improved.

It may be noted that the resistor R1 in the current memory circuit 3 is redundant in this integrator but it has been included in this description for completeness as it would be needed in a balanced integrator arrangement. Such a balanced integrator is illustrated in FIG. 5.

Figure 5:
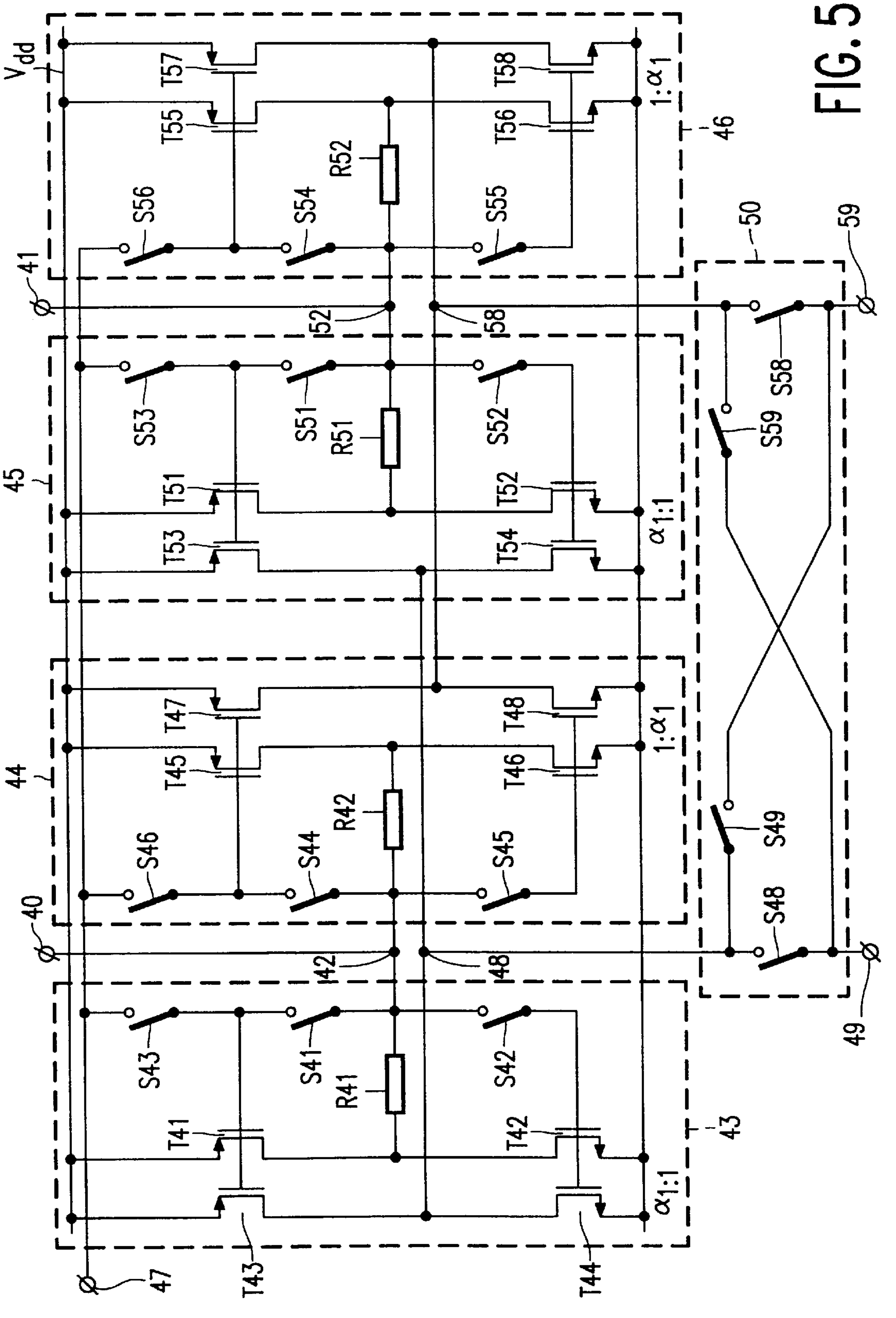
FIG. 5 is a circuit diagram of a circuit arrangement according to the invention arranged to process balanced current samples.

FIG. 5 shows a circuit arrangement according to the invention for processing differential currents. As shown in FIG. 5 the arrangement has first and second inputs 40 and 41 for receiving a differential input current. The input 40 is connected to a node 42 which is connected to the input and first output of two current memory circuits 43 and 44. The current memory circuit 43 comprises a P-channel field effect transistor T41 whose source electrode is connected to a supply rail Vdd and an N-channel field effect transistor T42 whose source electrode is connected to a supply rail Vss. The drain electrodes of transistors T41 and T42 are commoned and connected via a resistor R41 to the node 42. The node 42 is further connected to the junction of a first switch S41 and a second switch S42. The other end of the switch S42 is connected to the gate electrode of transistor T42, while the other end of switch S41 is connected to the gate electrode of transistor T41. A terminal 47 is connected via a switch S43 to the gate electrode of transistor T41, a reference voltage Ve being applied to terminal 47. A further P-channel field effect transistor T43 has its source electrodes connected to the supply rail $V_{dd}$ and its gate electrodes connected to the gate electrode of transistor T41. A further N-channel transistor T44 has its source electrode connected to the supply rail Vss and its gate electrode connected to the gate electrode of transistor T42. The drain electrodes of transistors T43 and T44 are commoned and connected to a node 48. The node 42 is further connected to a second current memory circuit 44 which comprises a P-channel field effect transistor T45, whose source electrode is connected to the supply rail $V_{dd}$, and an N-channel field effect transistor T46, whose source electrode is connected to the supply rail Vss. The drain electrodes of transistors T45 and T46 are commoned and connected via a resistor R42 to the node 42. The node 42 is further connected via a switch S44 to the gate electrode of transistor T45 and via a switch S45 to the gate electrode of transistor T46. The terminal 47 is connected via a switch S46 to the gate electrode of transistor T45. The current memory circuit 44 further comprises a P-channel field effect transistor T47, whose source electrode is connected to the supply rail $V_{dd}$ and whose gate electrode is connected to the gate electrode of transistor T45; and an N-channel field effect transistor T48 whose source electrode is connected to the supply rail Vss and whose gate electrode is connected to the gate electrode of transistor T46. The drain electrodes of transistors T47 and T48 are commoned and are connected to a node 58.

The input 41 is connected to a node 52 which is connected to the input of two further current memory circuits 45 and 46. The current memory circuit 46 comprises a P-channel transistor T51, whose source electrode is connected to the supply rail Vdd, and an N-channel field effect transistor T52 whose source electrode is connected to the supply rail Vss. The drain electrodes of transistor T51 and T52 are commoned and connected via a resistor R51 to the node 52. The node 52 is connected via a switch S51 to the gate electrode of transistor T51 and via a switch S52 to the gate electrode of transistor T52. The terminal 47 is connected via a switch S53 to the gate electrode of transistor T51. A P-channel field effect transistor T53 has its source electrode connected to the supply rail $V_{dd}$ and its gate electrode connected to the gate electrode of transistor T51. An N-channel field effect transistor T54 has its source electrode connected to the supply rail Vss and its gate electrode connected to the gate electrode of transistor T52. The junction of the drain electrodes of transistors T53 and T54 is connected to the node 48.

The current memory circuit 46 comprises a P-channel field effect transistor T55, whose source electrode is connected to the supply rail Vdd and an N-channel field effect transistor T56, whose source electrode is connected to the supply rail Vss. The drain electrodes of transistors T55 and T56 are connected via a resistor R52 to the node 52. The node 52 is further connected via a switch S54 to the gate electrode of transistor T55 and via a switch S55 to the gate electrode of transistor T56. The terminal 47 is connected via a switch S56 to the gate electrode of transistor T55. A P-channel field effect transistor T57 has its source electrode connected to the supply rail Vdd and its gate electrode connected to the gate electrode of transistor T55. An N-channel field effect transistor T58 has its source electrode connected to the supply rail Vss and its gate electrode connected to the gate electrode of transistor T56. The drain electrodes of the transistors T57 and T58 are connected to the node 58.

The nodes 48 and 58 are connected via a switching arrangement 50 to outputs 49 and 59 which produce a differential output current. The node 48 is connected to the output 49 via a switch S48 and to the output 59 via a switch S49. The node 58 is connected to the output 59 via a switch S58 and to the output 49 via a switch S59. In the arrangement of FIG. 5 the switches S42, S43, S55 and S56 are closed during the period $\alpha 1a$. The switches S45, S46, S52 and S53 are closed during the period $\phi 2a$. The switches S41 and S54 are closed during the period $\phi 1b$ and the switches S44 and S51 are closed during the period $\phi 2b$. Switches S48 and S58 are closed during the period $\phi 1$ while switches S49 and S59 are closed during the period $\phi 2$.

From an analysis of the arrangement shown in FIG. 5 it will be seen that this arrangement provides a differentiator function. This arises by the action of the output switches. A similar switching arrangement provided at the input would produce an integrator function. As will be seen from the later description of the biquadratic implementation the positioning of the switches may be conceptually at the input of the following integrator. Thus, provided that the various integrators/differentiators within a system are constructed using similar components it is possible to compensate for the on resistance of the switches whether the switches are conceptually at the input or the output of the arrangement. The compensation in the case of a differentiator being as illustrated in FIG. 5 whereas in the case of an integrator the compensation of switch resistance takes place for the memory cells of the driving circuit.

Figure 6:
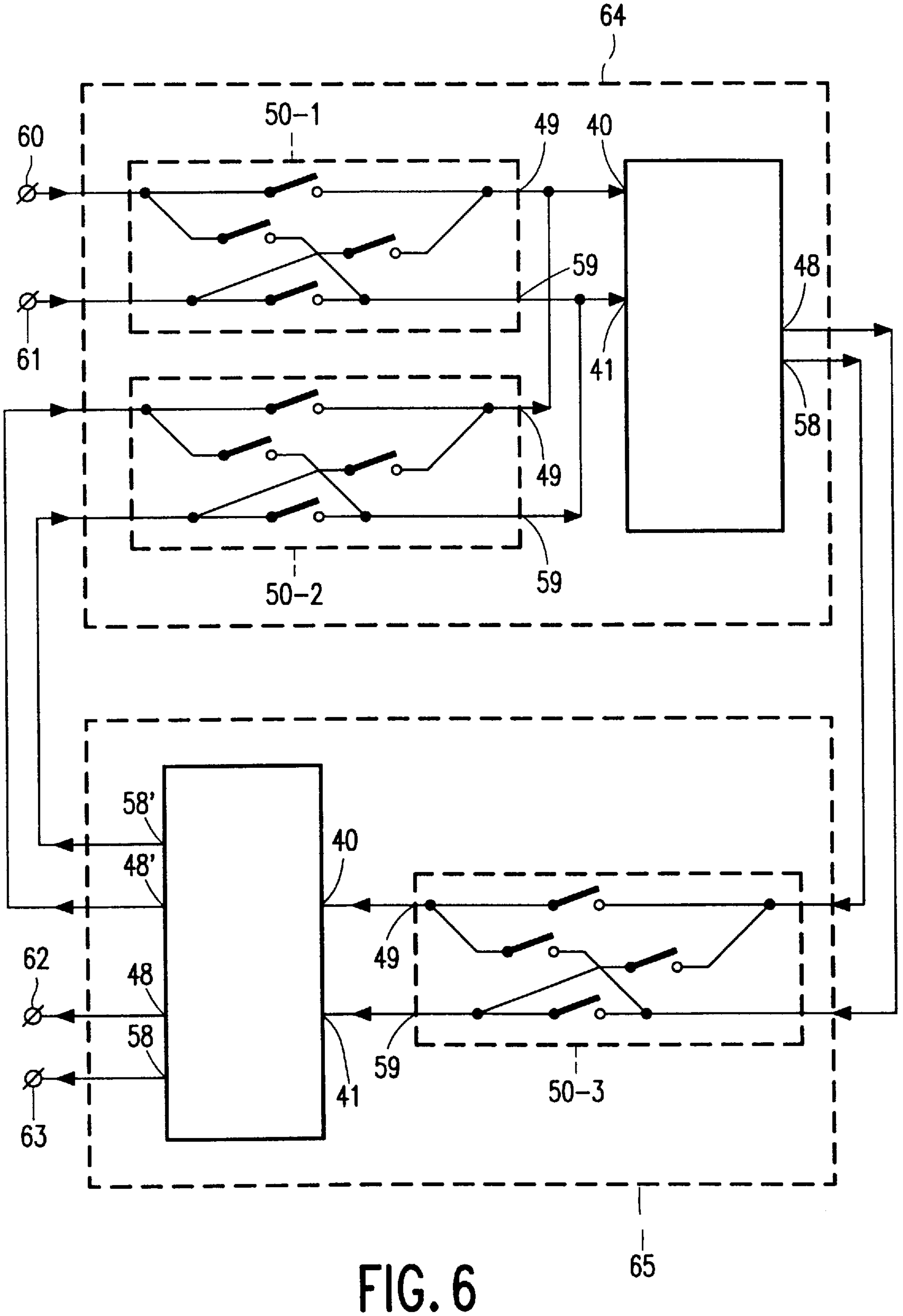
FIG. 6 illustrates a bi-quad section using integrator circuits according to the invention and FIG. 7 illustrates a biquad section using differentiator circuits according to the invention.

FIG. 6 illustrates how a simple biquad section can be implemented using integrators employing this invention. The biquad section shown in FIG. 6 has inputs 60 and 61 and outputs 62 and 63. It is formed from a lossless(or ideal) integrator 64 and a damped (or lossy) integrator 65. The lossless integrator 64 comprises two input switching arrangements 50-1 and 50-2 which are fed to inputs 40 and 41 which correspond to the inputs 40 and 41 of FIG. 5. It has outputs 48 and 58 which correspond to the output nodes 48 and 58 of FIG. 5. A similar switching arrangement 50-3 which is equivalent to the switching arrangement 50 of FIG. 5 is arranged at the input of the damped integrator 65 which in a similar manner to the integrator 64 has corresponding inputs 40 and 41 and outputs 48 and 58. The output nodes 48 and 58 are connected to the output terminals 62 and 63 while further output nodes 48' and 58' are fed to the switching arrangement 50-2 which is part of the lossless integrator 64. In this arrangement the switching arrangement 50-3 of the damped integrator 65 has switches dimensioned so that their "on" resistance is compensated by resistors within the current memory cells in the lossless integrator 64 and the switching arrangement 50-2 has switches whose on resistances are such that they are compensated by the resistances in the current memory cells of the damped integrator 65. Thus although the switching arrangements are constructed so as to be compensated by the resistors in the preceding (or driving) current memory cells they may be placed at the input of an integrator block. Each input path to the integrator is provided with a switching arrangement which is dimensioned to compensate for the "on" resistance of the switch by the resistance in the current memory cell of the driving integrator or other current source. It will be clear that this compensation arrangement can be applied to any source of the signal currents. The input sample current to a filter arrangement will normally be from a sample and hold circuit which will comprise a current memory circuit such as those described in the implementation of the integrators.

Figure 7:
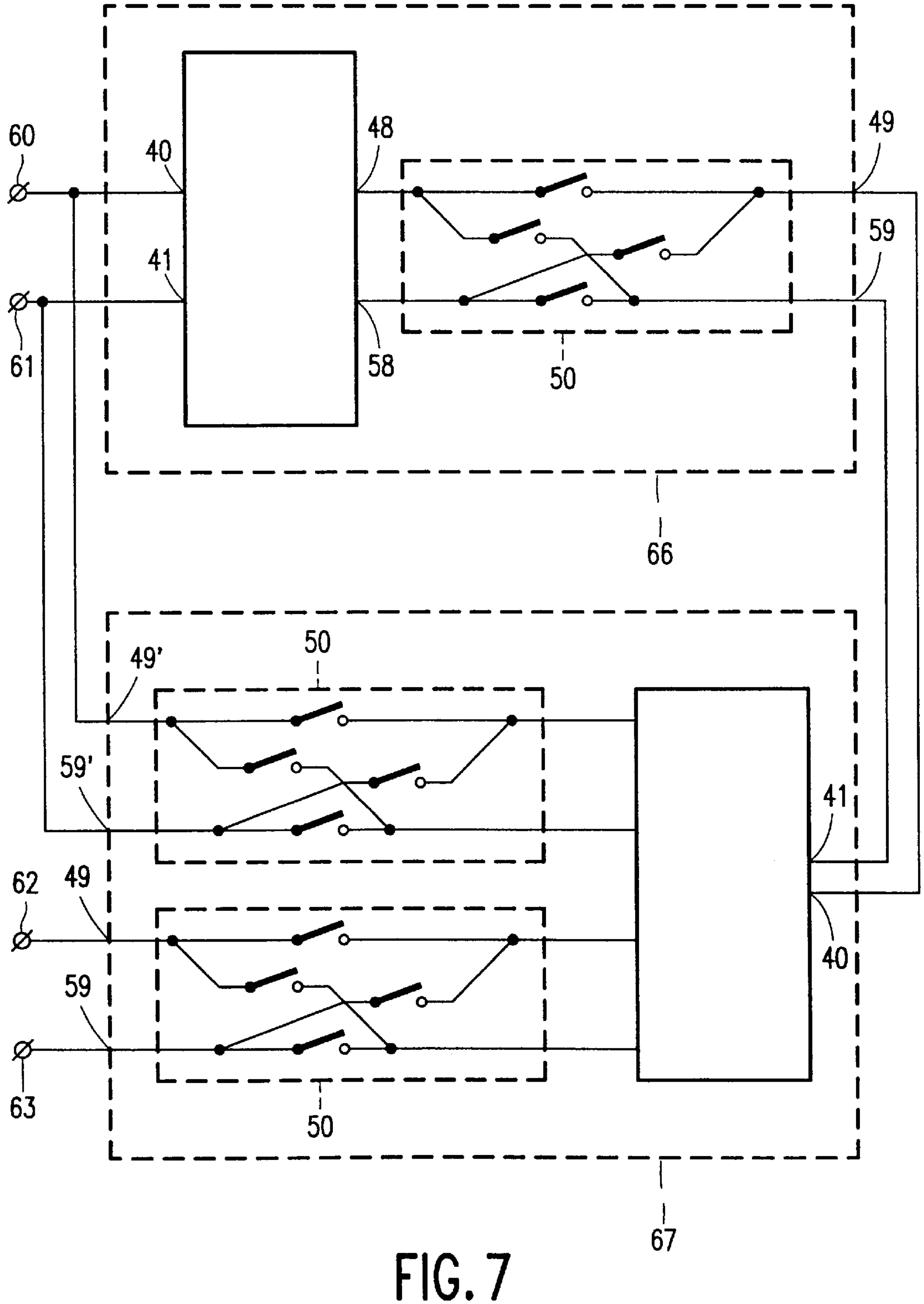

FIG. 7 shows a similar implementation of a biquadratic circuit using differentiators. In this case the biquad inputs 60 and 61 are fed to inputs 40 and 41 of a lossless differentiator 66 whose outputs 49 and 59 are fed to inputs 40 and 41 of a damped differentiator 67 first outputs of which 49 and 59 are connected to the outputs 62 and 63 of the biquad arrangement and second outputs 49" and 59" of which are fed to the inputs 40 and 41 of the lossless differentiator 66. In this instance in order to form differentiators the switching networks 50-1, 50-2, and 50-3 are connected at the output of the arrangements as is shown in FIG. 5. It will be noted that in both FIG. 6 and FIG. 7 the blocks may have more than one output. This is of course simply achieved by means of further current mirror branches the current memory circuits. It will be seen that the placing of the switching circuits 50 is purely conceptual in forming the differentiators and integrators within the biquad circuits. That is by moving the switching arrangement from the output of one block to the input of the other changes the conceptual arrangement from a differentiator into an integrator and it is only at the input and output of the biquad section that it can be certain whether the section has used integrators or differentiators.

The foregoing description has illustrated a simple integrator/differentiator block. The implementation of more complex blocks, such as bilinear integrators or differentiators (the differential block shown in FIG. 5 is bilinear) and lossy integrators and differentiators, will be apparent from a consideration of the circuit arrangements shown in the book referenced above and the teaching of the present description where it is shown that it is necessary to cause the current through each switch to be compensated by the resistance between the input and first output of the associated memory cell. Thus it is necessary for each switching arrangement to be dimensioned so that the "on" resistance of the switch is compensated by the resistance in the current memory cell. This is accomplished by ensuring that the ratio of the switch "on" resistance to the resistance in the current memory cell is the same as the ratio between the current produced by the first output of the current memory and the current produced by the output branch of the current memory to which that switch is connected.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claim have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A circuit arrangement for processing sampled analog currents comprising: an input for receiving said sampled analog currents, first and second current memories each having an input coupled to the input of the circuit arrangement and an output coupled to the input of the other current memory, the second current memory having at least one further output coupled to an output of the circuit arrangement, wherein the first and second current memories each comprise a first, coarse, current memory cell and a second, fine, current memory cell, and a switching arrangement couples the further output to said output of the circuit arrangement, characterized in that a resistor is connected between the input and first output of the second current memory, said resistor having a resistance substantially equal to the 'on' resistance of said switching arrangement multiplied by the scale factor relating to the relative magnitudes of the first and further output currents.

2. A circuit arrangement as claimed in claim 1 in which the second current memory comprises a plurality of further outputs, each of which is coupled via an individual further switching arrangement, wherein each further switching arrangement has a switch "on" resistance substantially equal to said resistance divided by the relative magnitude of its current output to the first current output.

3. A circuit arrangement as claimed in claim 2 in which said resistance comprises a transistor of the same type as those forming the switching arrangement, said transistor being held "on" by the same voltage as that of the switching signal which causes the switching arrangement to be switched on.

4. A circuit arrangement as claimed in claim 1 in which said first current memory cell has at least a further output, the further output being coupled to an output of the circuit arrangement by a respective switching arrangement wherein a resistor is connected between the input and output of the first current memory, said resistor having a resistance substantially equal to the "on" resistance of said switching arrangement multiplied by the scale factor relating to the relative magnitudes of the first and further output currents.

5. A circuit arrangement as claimed in claim 1 in which said resistance comprises a transistor of the same type as those forming the switching arrangement, said transistor being held "on" by the same voltage as that of the switching signal which causes the switching arrangement to be switched on.

6. A circuit arrangement as claimed in claim 5 in which said first current memory cell has at least a further output, the further output being coupled to an output of the circuit arrangement by a respective switching arrangement wherein a resistor is connected between the input and output of the first current memory, said resistor having a resistance substantially equal to the "on" resistance of said switching arrangement multiplied by the scale factor relating to the relative magnitudes of the first and further output currents.

7. A circuit arrangement as claimed in claim 2 in which said first current memory cell has at least a further output, the further output being coupled to an output of the circuit arrangement by a respective switching arrangement wherein a resistor is connected between the input and output of the first current memory, said resistor having a resistance substantially equal to the "on" resistance of said switching arrangement multiplied by the scale factor relating to the relative magnitudes of the first and further output currents.

8. A biquadratic filter section comprising a plurality of circuit arrangements for processing sampled analog currents, each of said circuit arrangements comprising an input for receiving said sampled analog currents, first and second current memories each having an input coupled to the input of the circuit arrangement and an output coupled to the input of the other current memory, the second current memory having at least one further output coupled to an output of the circuit arrangement, wherein the first and second current memories each comprise a first, coarse, current memory cell and a second, fine, current memory cell, and a switching arrangement couples the further output to said output of the circuit arrangement, characterized in that a resistor is connected between the input and first output of the second current memory, said resistor having a resistance substantially equal to the "on" resistance of said switching arrangement multiplied by the scale factor relating to the relative magnitudes of the first and further output currents.

* * * * *